United States Patent [19]

Hida

[11] Patent Number: 4,807,001
[45] Date of Patent: Feb. 21, 1989

[54] HETEROJUNCTION FIELD-EFFECT DEVICE

[75] Inventor: Hikaru Hida, Tokyo, Japan

[73] Assignee: NEC Corporation, Tokyo, Japan

[21] Appl. No.: 52,308

[22] Filed: May 21, 1987

[30] Foreign Application Priority Data

May 23, 1986 [JP] Japan .................................. 61-119458

[51] Int. Cl.$^4$ ........................................... H01L 29/80
[52] U.S. Cl. ......................................... 357/22; 357/16
[58] Field of Search ................. 357/22 A, 22 MD, 16, 357/23.2

[56] References Cited

U.S. PATENT DOCUMENTS

| | | | |
|---|---|---|---|
| 4,556,895 | 12/1985 | Ohata | 357/16 |
| 4,605,945 | 8/1986 | Katayama | 357/23.2 |
| 4,641,161 | 2/1987 | Kim | 357/15 |

*Primary Examiner*—Andrew J. James
*Assistant Examiner*—Mark Prenty

*Attorney, Agent, or Firm*—Sughrue, Mion, Zinn, Macpeak, and Seas

[57] ABSTRACT

For high speed operation and improvement in transconductance, there is disclosed a heterojunction field-effect device comprising, a first layer of a first compound semiconductor material having a relatively high donor impurity concentration, a second layer of a second compound semiconductor material formed on the first layer and having a relatively low donor impurity concentration and a relatively large electron affinity, a third layer of high-purity compound semiconductor material formed on the second layer and having a relatively small electron affinity, a gate electrode formed on the third layer, a source electrode formed on one side of the gate electrode and electrically connected to the first and second layers, and a drain electrode formed on the other side of the gate electrode and electrically connected to the first and second layers, so that a carrier-accumulation layer takes place in the second layer of the relatively low donor impurity concentration due to the difference in electron affinity between the second and third layers.

7 Claims, 3 Drawing Sheets

HETEROJUNCTION FIELD-EFFECT DEVICE

FIELD OF THE INVENTION

This invention relates to a semiconductor device and, more particularly, to a heterojunction field-effect transistor operable at a high-speed and with a large current driving capability.

BACKGROUND OF THE INVENTION

Growing research and development efforts are being made for faster semiconductor device with an emphasis put on MES (metal-semiconductor) field-effect transistors and heterojunction field-effect transistor using two-dimensional electron gas.

In general, a MES field-effect transistor using a gallium arsenide (GaAs) layer has a channel region doped to an impurity atom concentration of about $2 \times 10^{17}$ cm$^{-3}$, so that a shift in the threshold voltage tends to take place when shortening the gate length thereof so as to achieve a faster operation. The shift in the threshold voltage gives rise to deteriorate the reliability of the transistor. Moreover, the MES field-effect transistor suffers a small transconductance because of the low carrier density of the channel.

For a solution of these problems inherent in the MES field-effect transistor, a MES field-effect transistor is disclosed in IEEE Transaction on Electron Devices vol. 31, No. 8 1984, page 1032. The MES field-effect transistor disclosed in the above mentioned paper has a channel region doped to an impurity atom concentration of about $5 \times 10^{18}$ cm$^{-3}$ in order to prevent the field effect transistor from the shift in the threshold voltage and enhance the transconductance thereof, however problems are encountered in low breakdown voltages at the gate and the junction between the drain and the channel region due to heavily doped impurity atoms below the gate electrode. Moreover, it is impossible to produce a channel with a carrier density higher than the impurity atom concentration of about $5 \times 10^{18}$ cm$^{-3}$, so that the MES field-effect transistor has another problem in small current driving capability. Another prior-art MES field-effect transistor is disclosed by H. Dämbkes et al in "GaAs-MESFETs WITH HIGHLY DOPED ($10^{18}$ cm$^{-3}$) CHANNELS-AN EXPERIMENTAL AND NUMERICAL INVESTIGATION", IEDM Technical Digest, 1983, pages 621 to 624, in which Dämbkes et al propose the MES field-effect transistor with heavily doped channel region of about $1.5 \times 10^{18}$ cm$^{-3}$ which is free from the disadvantages due to the short-channel effects, but the proposed MES field-effect transistor also suffers a small amount of output current. Further, the heavily doped channel region leads to a problem in low controllability over the threshold voltage during fabrication process.

On the other hand, a heterojunction field-effect transistor having AlGaAs/GaAs structures generally has a large transconductance but suffers a small current driving capability due to the carrier density lower than about $1 \times 10^{12}$ cm$^{-3}$ as stated in IEEE Transaction on Electron Devices vol. 31, No.1 1984, page 29. A typical heterojunction field-effect transistor is described in Japanese Publication of Examined Application No. 53714/1984 and comprises a semi-insulating substrate, a multi-layer structure consisting of a doped barrier layer of aluminum gallium arsenide and a channel layer of gallium arsenide for providing a heterojunction therebetween, and gate, source and drain electrodes formed on the multi-layer structure. The heterojunction field-effect transistor described in the Japanese Publication of Examined Application uses the aforesaid multi-layer structure to produced a two-dimensional electron gas along the heterojunction between the doped barrier layer and the channel layer for a faster operation, but the doped barrier layer leads to problems in low controllability over the threshold voltage during fabrication process and in low breakdown voltage. Another heterojunction field-effect transistor is disclosed by P. M. Solomon et al in "A GaAs Gate Heterojunction FET", IEEE Electron Device Letters, vol. EDL-5, No.9, September 1984, pages 379 to 381. The heterojunction field-effect transistor proposed by P. M. Solomon et al comprises a semi-insulating substrate, a 1-micron undoped gallium arsenide buffer layer grown on the substrate, a 60-nm layer of undoped aluminum gallium arsenide ($A_{0.4}Ga_{0.6}As$) grown on the buffer layer, a 0.4 micron gate layer of n+gallium arsenide doped with silicon atoms and a gate electrode of molybdenum, and operates at an improved speed. However, the field-effect transistor basically operates in normally-off mode only, so that the structure is not applicable to some integrated circuits. Another heterojunction field-effect transistor is disclosed by N. C. Cirillo, Jr. et al in "Realization of n-Channel and p-Channel High-Mobility (Al,-Ga)As/GaAs Heterostructure Insulating Gate FET's on a Planar Wafer Surface", IEEE ELECTRON DEVICE LETTERS, Vol. EDL-6, No. 12, December 1985, pages 645 to 647. The field-effect transistor proposed by N. C. Cirillo, Jr. comprises a semi-insulating gallium arsenide substrate, a 500-nm thick p$^-$-type gallium arsenide buffer grown on the semi-insulating substrate, a 45-nm thick undoped p$^-$Al$_{0.3}$Ga$_{0.7}$As gate insulator layer grown on the buffer, source and drain region formed in the gate insulator layer by selective ion implantation and a WSi gate formed on the gate insulator layer. However, this heterojunction field-effect transistor also operates in normally-off mode only, so that this structure merely has a limited application similar to that proposed by P. M. Solomon. Still another structure of a field-effect transistor is disclosed in Japanese Publication of Unexamined Application No. 61265/1976. This field-effect transistor comprises a substrate formed of an n-type gallium arsenide, a surface inactivation film of gallium nitride formed on the substrate and having a wider band gap than that of the substrate. The surface inactivation film is grown by vapor phase epitaxy and the resultant structure aims at improvement in interface condition between the substrate and the surface inactivation film.

The closest structure may be disclosed by the Applicant in the specification of the U.S. patent application Ser. No. 024,213 filed on Mar. 10, 1987. The heterojunction field-effect transistor described in the specification is fabricated on a semi-insulating substrate of gallium arsenide and comprises a buffer layer of gallium arsenide formed on the semi-insulating substrate, an n-type gallium arsenide layer formed on the buffer layer and having a high impurity atom concentration, a high-purity aluminum gallium arsenide layer formed on the n-type gallium arsenide layer and a gate electrode formed on the high-purity aluminum gallium arsenide layer. In the heterojunction field-effect transistor, a large amount of electrons takes place at the interface between the high-purity aluminum gallium arsenide layer and the n-type gallium arsenide layer under a sufficiently high gate voltage, and the field-effect transistor can operate at an improved speed with a high withstand voltage. However, the heterojunction field-effect transistor described in the specification has a room for improvement in speed and transconductance.

SUMMARY OF THE INVENTION

It is therefore an important object of the present invention to provide a heterojunction field-effect device operable at an improved speed and having a large transconductance.

It is another important object of the present invention to provide a heterojunction field-effect transistor having a sufficiently high withstand voltage.

It is still another important object of the present invention to provide the structure of heterojunction field-effect device applicable to both normally-off transistor and normally-on transistor.

In accordance with one aspect of the present invention, there is provided a heterojunction field-effect device comprising (1) a first layer of a first semiconductor material having a relatively high donor impurity concentration, (2) a second layer of a second semiconductor material formed on the first layer and having a relatively low donor impurity concentration and a relatively large electron affinity, (3) a third layer of a high-purity semiconductor material formed on the second layer and having a relatively small electron affinity, (4) a gate electrode formed on the third layer, (5) a source electrode formed on one side of the gate electrode and electrically connected to the first and second layers, and (6) a drain electrode formed on the other side of the gate electrode and electrically connected to the first and second layers. The heterojunction field-effect device may be fabricated on a semi-insulating structure including a high-resistive substrate and further comprise a multi-layer structure formed between the first layer and the gate electrode and providing a p-n junction.

In accordance with another aspect of the present invention, there is provided a heterojunction field-effect device comprising (1) a first layer of a first semiconductor material having a relatively high acceptor impurity concentration, (2) a second layer of a second semiconductor material formed on the first layer and having a relatively low acceptor impurity concentration and the relatively small sum of the energy band-gap and the electron affinity, (3) a third layer of a high-purity semiconductor material formed on the second layer and having the relatively large sum of the energy band-gap and the electron affinity, (4) a gate electrode formed on the third layer, (5) a source electrode formed on one side of the gate electrode and electrically connected to the first and second layers, and (6) a drain electrode formed on the other side of the gate electrode and electrically connected to the first and second layers.

BRIEF DESCRIPTION OF THE DRAWINGS

The features and advantages of a heterojunction field-effect device according to the present invention will be more clearly understood from the following description taken in conjunction with the accompanying drawings in which.

DESCRIPTION OF THE PREFERRED EMBODIMENTS

First Embodiment

Figure 1:
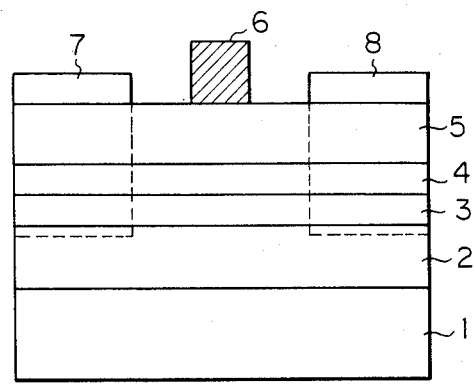
FIG. 1 is a cross sectional view showing the structure of a first embodiment according to the present invention.

Referring to FIG. 1 of the drawings, there is shown the structure of a heterojunction field effect transistor which is fabricated on a semi-insulating structure comprising a high-resistive substrate 1 of gallium arsenide and a buffer layer 2 of gallium arsenide with a donor impurity concentration lower than about $1 \times 10^{15}$ cm$^{-3}$. The buffer layer 2 is 5000 angstroms thick and aims at improvement in crystal quality. On the buffer layer 2 is formed a first layer 3 of n-type gallium arsenide with a donor impurity concentration of about $3 \times 10^{18}$ cm$^{-3}$. The first layer 3 has a thickness of about 100 angstroms. A second layer 4 is formed on the first layer 3 and made of gallium arsenide. The second layer 4 has a donor impurity concentration lower than $1 \times 10^{15}$ cm$^{-3}$ and a thickness of about 100 angstroms. On the second layer 4 is formed a third layer 5 of high-purity aluminum gallium arsenide ($Al_{0.3}Ga_{0.7}As$) which has an impurity atom concentration lower than about $1 \times 10^{15}$ cm$^{-3}$ and a thickness of 200 angstroms. A gate electrode 6 of aluminum is formed on the third layer 5, and ohmic regions 7 and 8 are formed on the both sides of the gate electrode 6. The ohmic regions 7 and 8 are formed by using an aurum-germanium-nickel alloy. In this instance, the third layer 5 of high-purity aluminum gallium arsenide is provided between the gate electrode 6 and the second layer 4, so that an electric field induced under application of a gate voltage is decreased with respect to each prior-art structure having a gate electrode directly contacting with a heavily doped layer. This results in improvement in withstand voltage.

Figure 2:
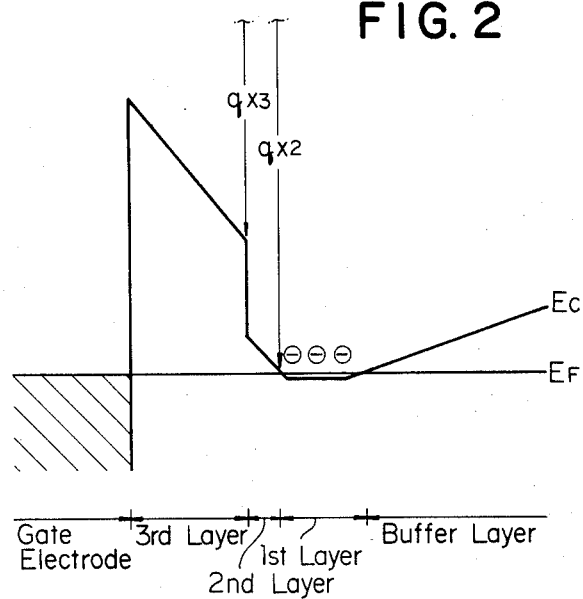
FIG. 2 is an energy band diagram of a portion under the gate electrode of the first embodiment in thermal equilibrium.
Figure 3:
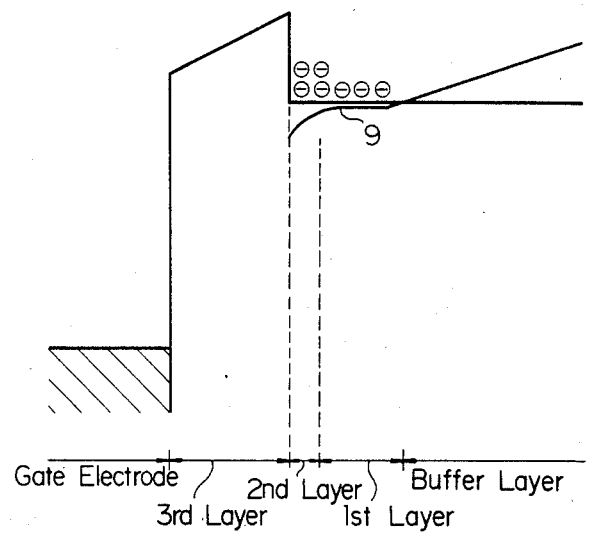
FIG. 3 is an energy band diagram of the portion of the first embodiment under application of a gate voltage greater than the flat-band voltage.

When the heterojunction field-effect transistor illustrated in FIG. 1 is in thermal equilibrium, the energy levels of the semiconductor layers forming in combination the heterojunction field-effect transistor are represented by the diagram shown in FIG. 2 in which $E_F$ and $E_C$ indicate the Fermi level and the lower edge of the conduction band, respectively. As will be seen from FIG. 2, the compound semiconductor (GaAs) providing the second layer 4 has a relatively large electron affinity $qX_2$, and, on the other hand, the ternary compound semiconductor ($Al_{0.3}Ga_{0.7}As$) providing the third layer 5 has a relatively small electron affinity $qX_3$ so that an electron-accumulation layer can take place in the second layer 4 due to the difference in electron affinity. When a voltage $V_G$ higher than a flat-band voltage $V_{FB}$ is applied to the gate electrode 6, the energy band diagram is changed as shown in FIG. 3 where reference numeral 9 indicates a high-density electron-accumulation layer produced in the second layer 4. The electron-accumulation layer 9 takes place in the second layer 4 under application of the voltage $V_G$ so that the electron-accumulation layer 9 has an electron concentration higher than the doping concentration of the first layer 3, which results in a large output current. Under a voltage $V_G$ higher than the flat-band voltage, the electron-accumulation layer 9 is produced in the second layer 4 of the low donor impurity concentration so that each of the electrons participating in current conduction has a less possibility of scattering due to a small amount of ionized impurity atoms. Moreover, a channel induced in the second layer 4 has the sufficiently high electron concentration in comparison with the doping concentration of the first layer 3, so that the sufficiently high electron concentration restricts the Coulomb scattering. These result in an increased electron mobility, and, for this reason, the heterojunction field-effect transistor illustrated in FIG. 1 has an improved transconductance and large current driving capability. In fact, it is possible to apply +1.4 volt to the gate electrode 6 of the heterojunction field-effect transistor shown in FIG. 1, and the maximum intrinsic transconductance of 500 mili siemens/mm is obtained. As a result, the structure illustrated in FIG. 1 is suitable for a high-speed field-effect transistor and a high-frequency device. Further, the current density is one and half times or twice as large as that of the prior-art field effect transistor. No breakdown occurs until a gate voltage excess about 10 volts, and the drain withstand voltage is about 20 volts. As will be understood from these results, it is possible to realize a heterojunction field effect transistor operable at an improved speed and having large withstand voltages and a large current driving capability by using the structure shown in FIG. 1.

Additionally, an insulating film of, for example, aluminum oxide ($Al_2O_3$) is applicable to the third layer 5, however the surface state density should be reduced.

In operation, the heterojunction field-effect transistor illustrated in FIG. 1 is operable in the similar manner to a MES field-effect transistor in the gate voltage higher than the threshold voltage $V_T$ thereof but insufficient to produce an electron-accumulation layer 9. Namely, the heterojunction field-effect transistor is controlled by changing the width of the depletion layer produced below the gate electrode 6 depending upon the gate voltage. However, after formation of the electron-accumulation layer 9, the heterojunction field-effect transistor changes the output current depending upon the amount of charges induced at the interface between the second layer 4 and the third layer 5. The electron density Qs follows the Gaussian low and is calculated by Equation 1:

$$Q_s = \epsilon E/q \quad \text{(Eq. 1)}$$

where $\epsilon$ is a dielectric constant of the third layer 5, E is a surface electric field, and q is charge of an electron. For the sake of simplicity, we assume that the third layer 5 has a negligible amount of impurity atoms or an impurity concentration of zero. The third layer 5 of aluminum gallium arsenide ($Al_{0.3}Ga_{0.7}As$) has a thickness of 200 angstroms and a dielectric constant $\epsilon = 12 \epsilon_0$ where $\epsilon_0$ is the dielectric constant in vacuum. When a voltage $V_G$ higher than the flat-band voltage $V_{FB}$ by 1 volt is applied to the gate electrode 6, the electric field E of 0.5 mega V/cm is produced. Then, the electron density in the interface between the second and third layers 4 and 5 is $3.3 \times 10^{12}$ cm$^{-2}$. This electron density is approximately equal to the maximum electron density of the first layer 3 having the donor impurity concentration of $3 \times 10^{18}$ cm$^{-3}$ and the thickness of 100 angstroms. As a result, it is possible to have the total electron density of $6 \times 10^{12}$ cm$^{-2}$ which is twice as large as that of the maximum electron density of the first layer 3. In general, the maximum current value available in the field-effect transistor is proportional to the total electron density so that it is understood that the heterojunction field-effect transistor shown in FIG. 1 has a large current driving capability.

The field-effect transistor described above operates as a normally-off type transistor and is appropriate for a driver of a high-speed and low-power consumption DCFL (Direct Coupled FET Logic) circuit. However, if the field-effect transistor has an n-type first layer thicker than the first layer 3 and greater in impurity atom concentration than that of the first layer 3, the field-effect transistor can operate as a normally-on type transistor. For example, a field-effect transistor comprises an n-type first layer with a thickness of about 200 angstroms instead of the first layer 3, the field-effect transistor has a threshold voltage of about −2 volts. The normally-on type field-effect transistor can be used for a circuit component of a high-speed logic circuit such as, for example, a BFL (Buffered FET Logic) circuit. Moreover, the normally-on type field-effect transistor is a potential candidate for a high-power device. In fact, a normally-on type field effect transistor of the type described above produces an output of about 500 mW at a high frequency on the order of 30 GHz. In the field-effect transistor according to the present invention, the n-type first layer 3 typically has a donor impurity concentration ranging between about $0.5 \times 10^{18}$ cm$^{-3}$ and about $5 \times 10^{18}$ cm$^{-3}$ in order to enhance the current driving capability and the withstand voltage.

Additionally, electrons participate in conduction current in the heterojunction field-effect transistor illustrated in FIG. 1, however it is possible to realize a heterojunction field-effect transistor using holes as carrier participating in conduction current.

Second Embodiment

Figure 4:
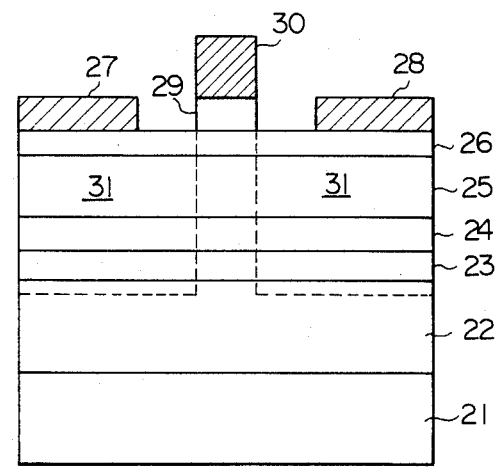
FIG. 4 is a sectional view showing the structure of a second embodiment according to the present invention.

Turning to FIG. 4 of the drawings, there is shown another structure of a heterojunction field-effect transistor embodying the present invention. The heterojunction field-effect transistor illustrated in FIG. 4 is fabricated on a semi-insulating structure consisting of a high-resistive substrate 21 of gallium arsenide and a buffer layer 22 of p-type gallium arsenide having a thickness of about 5000 angstroms and an acceptor impurity concentration of about $1 \times 10^{16}$ cm$^{-3}$. In this instance, the buffer layer 22 is formed by the lightly doped p-type gallium arsenide so that the shift in threshold voltage is smaller than that of each prior-art field effect transistor if both of the field-effect transistors have the channels of equal length. The heterojunction field-effect transistor illustrated in FIG. 4 comprises a first layer 23 of heavily doped n-type gallium arsenide, a second layer 24 of gallium arsenide, a third layer 25 of aluminum gallium arsenide ($Al_{0.3}Ga_{0.7}As$), a fourth layer 26 of heavily doped n-type gallium arsenide, ohmic electrodes 27 and 28 of an aurum-germanium-nickel alloy, a pad layer 29 of heavily doped p-type gallium arsenide and a gate electrode 30 of wolfram. Reference numeral 31 designates heavily doped n-type regions which have a donor impurity concentration of about $5 \times 10^{18}$ cm$^{-3}$ and aim at reduction in parasitic resistance. These heavily doped n-type regions 31 are formed by ion implantation, and a selected epitaxial layer grown by vapor-phase epitaxy is applicable to form the heavily doped n-type regions 31. The first layer 23 is about 200 angstroms thick and has a donor impurity concentration of about $3\times10^{18}$ cm$^{-3}$. The second layer 24 is about 100 angstroms thick and has an impurity atom concentration lower than about $1\times10^{15}$ cm$^{-3}$. The third layer 25 is about 100 angstroms and has an impurity atom concentration lower than about $1\times10^{15}$ cm$^{-3}$. The fourth layer 26 has a thickness of about 100 angstroms and a donor impurity concentration of about $2\times10^{17}$ cm$^{-3}$ and aims at forming ohmic contacts to the electrodes 27 and 28. The pad layer 29 is about 200 angstroms thick and has an acceptor impurity concentration of about $3\times10^{19}$ cm$^{-3}$. The pad layer 29 thus doped with acceptor impurity atoms and the n-type fourth layer 26 forms in combination a p-n junction at the interface thereof which provides a high built-in potential, so that the structure shown in FIG. 4 is useful to realize a normally-off type heterojunction field-effect transistor having a wide logic amplitude.

In the embodiment shown in FIG. 4, the second layer 24 is formed of gallium arsenide, however indium gallium arsenide is available to form the second layer. A second layer of indium gallium arsenide has a large difference in electron affinity with respect to the third layer 25 of aluminum gallium arsenide so that a large amount of electrons are produced in the second layer. This results in enhancement of electron mobility and improvement in device characteristics.

Third Embodiment

Figure 5:
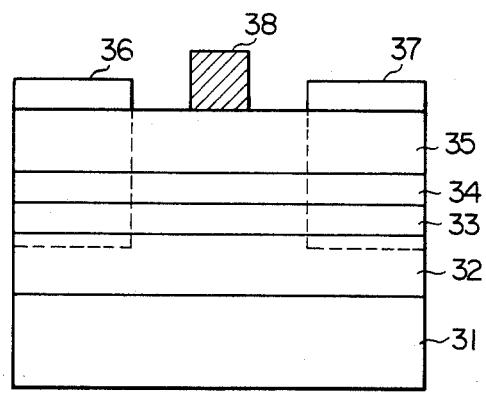
FIG. 5 is a sectional view showing the structure of a third embodiment according to the present invention.
Figure 6:
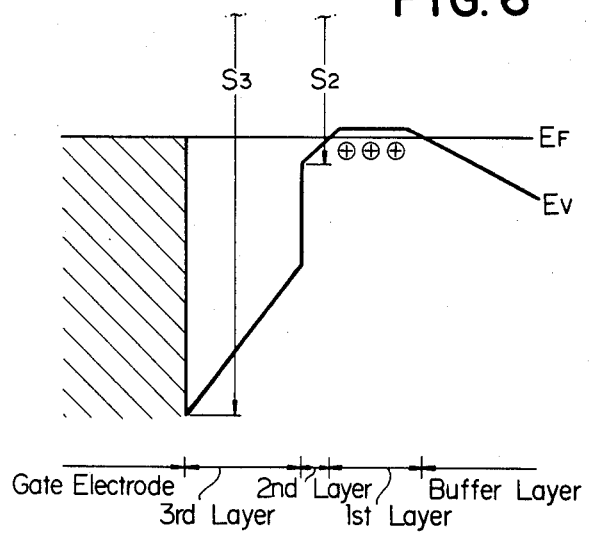
FIG. 6 is an energy band diagram of a portion under the gate electrode of the third embodiment in thermal equilibrium.

Turning to FIG. 5 of the drawings, there is shown still another structure of a heterojunction field-effect transistor embodying the present invention. The field-effect transistor is fabricated on a semi-insulating structure consisting of a high-resistive gallium arsenide substrate 31 and a buffer layer 32 which has an impurity atom concentration lower than about $1\times10^{15}$ cm$^{-3}$ and a thickness of about 1 micron. The heterojunction field-effect transistor illustrated in FIG. 5 comprises a first layer 33 of p-type germanium having a thickness of about 100 angstroms and an acceptor impurity concentration of about $3\times10^{18}$ cm$^{-3}$, a second layer 34 of germanium having a thickness of about 100 angstroms and an acceptor impurity concentration lower than about $1\times10^{15}$ cm$^{-3}$, a third layer 35 of gallium arsenide having a thickness of about 200 angstroms and an impurity atom concentration lower than about $1\times10^{15}$ cm$^{-3}$, ohmic electrodes 36 and 37 of an aurum-zinc alloy and a gate electrode 38 of aluminum. However, the first layer 33 may have an acceptor impurity concentration ranging between about $0.5\times10^{18}$ cm$^{-3}$ and about $5\times10^{18}$ cm$^{-3}$. Energy band diagram of the heterojunction field-effect transistor illustrated in FIG. 5 is shown in FIG. 6, in which $E_F$ and $E_V$ designate the Fermi level and the upper valence band edge, respectively. As will be seen from FIG., 6, the second layer 34 has the sum of the electron affinity and the energy-band gap (S2) smaller than the sum of the electron affinity and the energy band-gap of the third layer 35 (S3), so that holes produced in the second layer 34 serve as carrier.

In operation, when a voltage shifted to negative side with respect to a flat-band voltage $V_{FB}$ is applied to the gate electrode 38, a hole-accumulation layer is produced in the second layer 34 and the holes participate in current conduction.

As will be understood from the foregoing description, the heterojunction field-effect transistor has the second layer of low impurity atom concentration provided between the first layer and the third layer so that the carrier-accumulation layer does not take place in the first layer of high impurity atom concentration, but is produced in the second layer of low impurity atom concentration. This results in high electron mobility and large current driving capability.

Although particular embodiments of the present invention have been shown and described, it will be obvious to those skilled in the art that various changes and modifications may be made without departing from the spirit and scope of the present invention.

What is claimed is:

1. A heterojunction field-effect device comprising:
   (1) a first layer of a first semiconductor material having a relatively high donor impurity concentration greater than $1\times10^{18}$ cm$^{-3}$ but equal to or less than about $5\times10^{18}$ cm$^{-3}$, said first layer having a thickness equal to or less than 200 angstroms;
   (2) a second layer of a second semiconductor material formed on said first layer and having a relatively low donor impurity concentration and a relatively large electron affinity;
   (3) a third layer of high-purity semiconductor material formed on said second layer and having a relatively small electron affinity;
   (4) a gate electrode formed on said third layer;
   (5) a source electrode formed on one side of said gate electrode and electrically connected to said first and second layers; and
   (6) a drain electrode formed on the other side of said gate electrode and electrically connected to said first and second layers, in which said first, second and third layers are formed of a gallium arsenide, an indium gallium arsenide and an aluminum gallium arsenide, respectively.

2. A heterojunction field-effect device comprising:
   (1) a first layer of a first semiconductor material having a relatively high acceptor impurity concentration greater than $1\times10^{18}$ cm$^{-3}$ but equal to or less than about $5\times10^{18}$ cm$^{-3}$, said first layer having a thickness equal to or less than 200 angstroms;
   (2) a second layer of a second semiconductor material formed on said first layer and having a relatively low acceptor impurity concentration and the relatively small sum of the energy band-gap and the electron affinity;
   (3) a third layer of a high-purity semiconductor material formed on said second layer and having the relatively large sum of the energy band-gap and the electron affinity;
   (4) a gate electrode formed on said third layer;
   (5) a source electrode formed on one side of said gate electrode and electrically connected to said first and second layers; and
   (6) a drain electrode formed on the other side of said gate electrode and electrically connected to said first and second layers.

3. A heterojunction field-effect device comprising:
   (1) a first layer of a first semiconductor material having a relatively high donor impurity concentration;
   (2) a second layer of a second semiconductor material formed on said first layer and having a relatively low donor impurity concentration and a relatively large electron affinity;

(3) a third layer of high-purity semiconductor material formed on said second layer and having a relatively small electron affinity;

(4) a fourth layer of gallium arsenide having an acceptor impurity concentration of about $1 \times 10^{16}$ cm$^{-3}$ and a thickness ranging between about 5000 angstroms and about 1 micron, said first layer being formed on said fourth layer;

(5) a gate electrode formed on said third layer;

(6) a source electrode formed on one side of said gate electrode and electrically connected to said first and second layers; and (7) a drain electrode formed on the other side of said gate electrode and electrically connected to said first and second layers.

4. A heterojunction field-effect device comprising:

(1) a first layer of a first semiconductor material having a relatively high donor impurity concentration;

(2) a second layer of a second semiconductor material formed on said first layer and having a relatively low donor impurity concentration and a relatively large electron affinity;

(3) a third layer of high-purity semiconductor material formed on said second layer and having a relatively small electron affinity;

(4) a gate electrode formed on said third layer;

(5) a source electrode formed on one side of said gate layers;

(6) a drain electrode formed on the other side of said gate electrode and electrically connected to said first and second layers; and (7) a multi-layer structure formed between said third layer and said gate electrode and having at least two layers opposite in conductivity type to each other to form a p-n junction.

5. A heterojunction field-effect device as set forth in claim 2, in which at least one of said first, second and third layers forms lattice-mismatched junction together with the layer contacting therewith.

6. A heterojunction field-effect device as set forth in claim 2, in which said first and second semiconductor materials are different from each other.

7. A heterojunction field-effect transistor as set forth in claim 2, in which said first, second and third layers are formed of a germanium, a germanium and a gallium arsenide, respectively.

* * * * *